US008520110B2

(12) United States Patent  
Kitami et al.

(10) Patent No.: US 8,520,110 B2  
(45) Date of Patent: *Aug. 27, 2013

(54) SOLID-STATE IMAGING DEVICE, DRIVING CONTROL METHOD, AND IMAGING APPARATUS

(75) Inventors: Hirotaka Kitami, Kanagawa (JP); Kenichi Okumura, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/336,759

(22) Filed: Dec. 23, 2011

(65) Prior Publication Data

US 2012/0092538 A1 Apr. 19, 2012

Related U.S. Application Data

(63) Continuation of application No. 12/258,154, filed on Oct. 24, 2008, now Pat. No. 8,085,329.

(30) Foreign Application Priority Data

Nov. 16, 2007 (JP) ................. 2007-297958

(51) Int. Cl.
   *H04N 3/14* (2006.01)
   *H04N 5/217* (2011.01)
   *H04N 9/083* (2006.01)
   *H03M 1/12* (2006.01)
   *H03M 1/56* (2006.01)
   *H01L 27/00* (2006.01)
   *H01L 31/062* (2012.01)

(52) U.S. Cl.
   USPC ........... 348/308; 348/241; 348/243; 341/155; 341/169; 341/118; 250/208.1; 257/291; 257/292

(58) Field of Classification Search
   USPC ...... 348/241, 243, 248, 294–324; 250/208.1, 250/214.1, 214 R, 214; 341/169, 118, 155, 341/164, 122; 257/291–292
   See application file for complete search history.

(56) References Cited

U.S. PATENT DOCUMENTS

| 7,554,589 | B2 | 6/2009 | Boemier | |
|---|---|---|---|---|
| 8,085,329 | B2 * | 12/2011 | Kitami et al. | 348/308 |
| 2005/0195304 | A1 * | 9/2005 | Nitta et al. | 348/308 |
| 2005/0270393 | A1 * | 12/2005 | Noda et al. | 348/308 |
| 2005/0280730 | A1 * | 12/2005 | Lim et al. | 348/308 |
| 2007/0139544 | A1 * | 6/2007 | Egawa et al. | 348/308 |

FOREIGN PATENT DOCUMENTS

JP 2005-278135 10/2005

* cited by examiner

*Primary Examiner* — Nhan T Tran
*Assistant Examiner* — Marly Camargo
(74) *Attorney, Agent, or Firm* — Robert J. Depke; The Chicago Technology Law Group, LLC

(57) ABSTRACT

A solid-state imaging device and an imaging apparatus are provided. The solid-state imaging device performs an AD conversion in a column parallel for an analog pixel signal outputted from each of pixels disposed in a two-dimensional matrix shape. The solid-state imaging device includes: an AD conversion unit including a plurality of pixel signal accumulating units; a first switching unit for disconnecting parallel connection of a second pixel signal accumulating unit other than a first pixel signal accumulating unit which is one of the plurality of pixel signal accumulating units; and a second switching unit for connecting the second pixel signal accumulating unit to a pixel signal line of a second pixel adjacent to the first pixel in a row direction, when parallel connection of the second pixel signal accumulating unit is disconnected by the first switching unit.

7 Claims, 10 Drawing Sheets

SOLID-STATE IMAGING DEVICE, DRIVING CONTROL METHOD, AND IMAGING APPARATUS

CROSS-REFERENCE TO RELATED APPLICATIONS

The subject matter of application Ser. No. 12/258,154, is incorporated herein by reference. The present application is a Continuation of U.S. Ser. No. 12/258,154, filed Oct. 24, 2008, which claims priority to Japanese patent Application No. 2007-297958 filed in the Japanese Patent Office on Nov. 16, 2007, the entire disclosure of which is incorporated herein by reference.

BACKGROUND OF THE INVENTION

1. Field of the Invention

The present invention relates to a solid-state imaging device, a driving control method, and an imaging apparatus.

2. Description of Related Art

As a solid-state imaging device, a complementary metal-oxide semiconductor (CMOS) image sensor of a column parallel analog-digital (AD) conversion scheme (hereinafter called a column AD conversion scheme) has been proposed in which pixels are disposed two-dimensionally in a matrix shape and an analog-digital converter (ADC) is disposed for each column.

In recent years, a column AD conversion scheme CMOS image sensor improved to be suitable for high speed image capturing has been proposed. For example, Japanese Unexamined Patent Application Publication No. 2005-278135 discloses a column AD conversion scheme CMOS image sensor which achieves, by using up-down counters, a high frame rate and a high resolution without increasing a circuit scale.

FIG. 1 shows a configuration example of an ADC 1 of a column AD conversion scheme CMOS image sensor.

The ADC 1 includes as many column AD circuits 11 as the number of columns of pixels two-dimensionally disposed in a matrix shape, and pixel signals outputted from the respective pixels in the same column are subjected to an AD conversion in a time division manner at a corresponding column AD circuit 11.

In the column AD circuit 11, a reference signal from a digital-analog converter (DAC, not shown) is inputted via a capacitance element 12 to a comparator 14, and a pixel signal outputted from each pixel is inputted via a capacitance element 13 to the comparator 14. A reference signal supplied from DAC is a signal of a so-called ramp waveform which changes its level (voltage) in a slope shape with a lapse of time. The capacitance elements 12 and 13 remove DC components of the reference and pixel signals so that only AC components of the reference and pixel signals can be compared at the comparator 14.

The comparator 14 outputs a difference signal obtained through a comparison between the pixel signal and the reference signal to an up/down counter 15. When the reference signal is larger than the pixel signal, a difference signal at a high level is supplied to the up/down counter 15, whereas when the reference signal is smaller than the pixel signal, a difference signal at a low level is supplied to the up/down counter 15.

The up/down counter (U/D CNT) 15 down-counts in a pre-charge phase (P-phase) ADC enable period only while a difference signal at a high level is supplied, and up-counts in a data phase (D-phase) ADC enable period only while a difference signal at a high level is supplied. The P-phase ADC enable period is a period while reset components ΔV are measured which are pixel variation components, and the D-phase ADC enable period is a period while (signal components Vsig+reset components ΔV) are measured. By combining a count in the P-phase ADC enable period and a count in the D-phase ADC enable period, only the signal components Vsig which are (signal components Vsig+reset components ΔV)−(reset components ΔV) can be obtained to implement a CDS processing.

In the column AD conversion scheme CMOS image sensor having the ADC constructed as above, when it is necessary to perform pixel addition, the pixel addition processing is performed at a processing block after the up/down counter 15. Accordingly, a driving method for the ADC 1 is not different between performing pixel addition and not performing pixel addition, and a power consumption of the ADC 1 is the same for both performing pixel addition and not performing pixel addition.

In another method for pixel addition, a common floating diffusion (FD) portion is used for adjacent pixels in a vertical direction (column direction) in a pixel array having pixels two-dimensionally disposed in a matrix shape, to thereby perform pixel addition of the adjacent pixels in the vertical direction.

FIG. 2 shows a configuration example of a pixel array in which pixel addition of adjacent pixels in the vertical direction is performed by using a common FD portion of the adjacent pixels in the vertical direction.

Of pixels 21A and 21B adjacent in the vertical direction shown in FIG. 2, the pixel 21A includes a photodiode 31A and a transfer transistor 32A for transferring charges to an FD portion, and the pixel 21B includes a photodiode 31B and a transfer transistor 32B for transferring charges to the FD portion. A selection transistor 34 and an amplifier transistor 35 are provided in common for the pixels 21A and 21B.

In this case, by turning on the transfer transistors 32A and 32B at the same time, charges accumulated in the photodiode 31A and charges accumulated in the photodiode 31B are added together in a portion indicated by a broken line in FIG. 2. The added pixel signal is supplied to a comparator 14 because the drain of the amplifier transistor 35 is connected to a constant current source 36 and to a capacitance element 13 of a column AD circuit 11. Accordingly, pixel addition is performed for adjacent pixels in the vertical direction.

SUMMARY OF THE INVENTION

However, although the configuration shown in FIG. 2 may reduce a power consumption corresponding in amount to the common set of transistors and the like, this configuration cannot perform addition of excess capacity of the FD portion 33. Therefore, it is difficult to increase a pixel dynamic range.

Accordingly, it is desirable to implement pixel addition by using a simple structure and reduce power consumption.

In accordance with one aspect of the present invention, there is provided a solid-state imaging device which performs an AD conversion in a column parallel for an analog pixel signal outputted from each of pixels disposed in a two-dimensional matrix shape, the solid-state imaging device including an AD conversion unit, a first switching unit, and a second switching unit. The AD conversion unit includes a plurality of pixels signal accumulating units, a reference signal generating unit, and a comparing unit. The pixel signal accumulating unit provides the pixel signal supplied from a first pixel via a pixel signal line. The reference signal generating unit generates a reference signal of a ramp waveform. The comparing unit outputs a signal based on a comparison between the pixel signal and the references signal. The first switching unit disconnects parallel connection of a second pixel signal accumulating unit other than a first pixel signal accumulating unit which is one of the plurality of pixel signal accumulating units.

In accordance with another aspect of the present invention, there is provided a method for driving control of a solid-state imaging device which includes a plurality of pixel signal accumulating units, a reference signal generating unit for generating a reference signal of a ramp waveform, and a comparing unit for comparing an analog pixel signal outputted form a pixel with the reference signal and providing a signal output based on the comparison, thereby performing an AD conversion in a column parallel for the pixel signal outputted from each of pixels disposed in a two-dimensional matrix shape. The driving control method includes the steps of: accumulating, by the plurality of pixel signal accumulating unit, the pixel signal supplied from a first pixel via a pixel signal line; accumulating, by the reference signal accumulating unit, the reference signal; comparing, by the comparing unit, the pixel signal and the reference signal and outputting a resultant difference signal; when parallel connection of second pixel signal accumulating unit other than first pixel signal accumulating unit which is one of the plurality of pixel signal accumulating unit is disconnected by first switching unit and the second pixel signal accumulating unit is connected to a pixel signal line of a second pixel adjacent to the first pixel in a row direction by second switching unit, accumulating, by the plurality of pixel signal accumulating unit, the pixel signals supplied via pixel signal lines from the first and second pixels; and outputting, by the comparing means, a difference signal obtained through a comparison between the pixel signals supplied from the first and second pixels and the reference signal.

In accordance with a further aspect of the present invention, there is provided an imaging apparatus including a solid-state imaging device which performs an AD conversion in a column parallel for an analog pixel signal outputted from each of pixels disposed in a two-dimensional matrix shape, the solid-state imaging device including an AD conversion unit, a first switching unit, and a second switching unit. The AD conversion unit includes a plurality of pixels signal accumulating unit connected in parallel, a reference signal generating unit, and a comparing unit. The pixel signal accumulating unit provides the pixel signal supplied from a first pixel via a pixel signal line. The reference signal generating unit generates a reference signal of a ramp waveform. The comparing unit outputs a signal based on a comparison between the pixel signal and the references signal. The first switching unit disconnects parallel connection of a second pixel signal accumulating unit other than a first pixel signal accumulating unit which is one of the plurality of pixel signal accumulating units.

In the solid-state imaging device and imaging apparatus according to embodiments of the present invention, a plurality of pixel signal accumulating units accumulate the pixel signal supplied from a first pixel via a pixel signal line, a reference signal is generated by reference signal generating unit, and a signal based on a comparison between the pixel signal and reference signal is outputted from the comparing unit. A parallel connection of second pixel signal accumulating unit other than first pixel signal accumulating unit which is one of the plurality of pixel signal accumulating unit is disconnected by a first switching unit, and the second pixel signal accumulating unit is connected to a pixel signal line of a second pixel adjacent to the first pixel in a row direction, when parallel connection of the second pixel signal accumulating unit is disconnected by the first switching unit.

In the driving control method according to an embodiment of the present invention, a pixel signal supplied from a first pixel via a pixel signal line is accumulated at the plurality of pixel signal accumulating units; the reference signal is accumulated at the reference signal accumulating unit; and a difference signal obtained through comparison between the pixel signal and reference signal is outputted from the comparing unit. When parallel connection of second pixel signal accumulating unit other than first pixel signal accumulating unit which is one of the plurality of pixel signal accumulating unit is disconnected by the first switching unit and when the second pixel signal accumulating unit is connected to a pixel signal line of a second pixel adjacent to the first pixel in a row direction by second switching unit, the pixel signals supplied via pixel signal lines from the first and second pixels are accumulated at the plurality of pixel signal accumulating unit; and a difference signal obtained through a comparison between the pixel signals supplied from the first and second pixels and the reference signal is output from the comparing unit.

According to embodiments of the present invention, it is possible to implement pixel addition by using a simple structure and reduce power consumption.

DETAILED DESCRIPTION OF EMBODIMENTS

Figure 1:
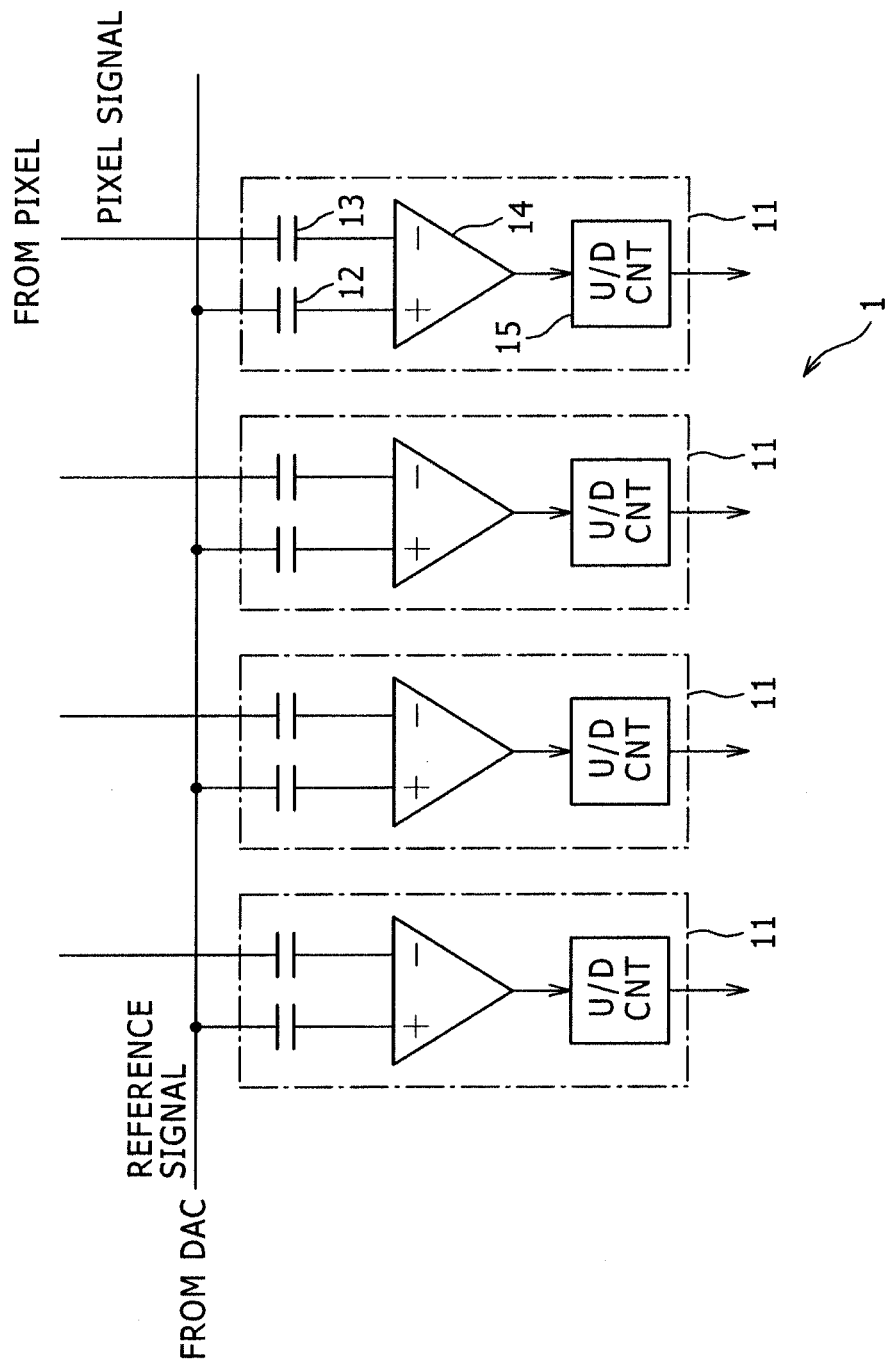
FIG. 1 is a diagram showing a configuration example of an ADC according to a known column AD conversion scheme CMOS image sensor.

In the following description of constituent features of the present invention, the correspondence between the disclosed inventions and the constituent features is as follows. The description is used for verifying that the embodiments supporting the inventions described in this specification are described in the specification. Therefore, the embodiment described in this specification as not corresponding to constituent feature is not intended to mean that the embodiment does not correspond to the constituent feature. Conversely, the embodiment described in this specification as corresponding to constituent feature is not intended to mean that the embodiment does not correspond to the constituent feature other than constituent features.

A solid-state imaging device according to an embodiment of the present invention is a solid-state imaging device (e.g., a solid-state imaging device 51 shown in FIG. 3) which performs an AD conversion in a column parallel for an analog pixel signal outputted from each of pixels disposed in a two-dimensional matrix shape. The solid-state imaging device includes: an AD conversion unit (e.g., a column AD circuit 81a shown in FIG. 4) including a plurality of pixel signal accumulating unit (e.g., capacitance elements 102a and 103a shown in FIG. 4) connected in parallel for accumulating the pixel signal supplied from a first pixel via a pixel signal line (e.g., a vertical signal line 71a shown in FIG. 4), a reference signal accumulating unit (e.g., a capacitance element 101a shown in FIG. 4) for accumulating a reference signal of a ramp waveform, and a comparing unit (e.g., a voltage comparison unit 82a shown in FIG. 4) for outputting a difference signal obtained through a comparison between the pixel signal and the reference signal: a first switching unit (a switch 111a shown in FIG. 4) for disconnecting parallel connection of a second pixel signal accumulating unit (e.g., a capacitance element 111a shown in FIG. 4) other than a first pixel signal accumulating unit (e.g., a capacitance element 102a shown in FIG. 4) which is one of the plurality of pixel signal accumulating unit; and a second switching unit (a switch 112a shown in FIG. 4) for connecting the second pixel signal accumulating unit to a pixel signal line of a second pixel adjacent to the first pixel in a row direction, when parallel connection of the second pixel signal accumulating unit is disconnected by the first switching unit.

Embodiments of the present invention will now be described with reference to the accompanying drawings.

Figure 3:
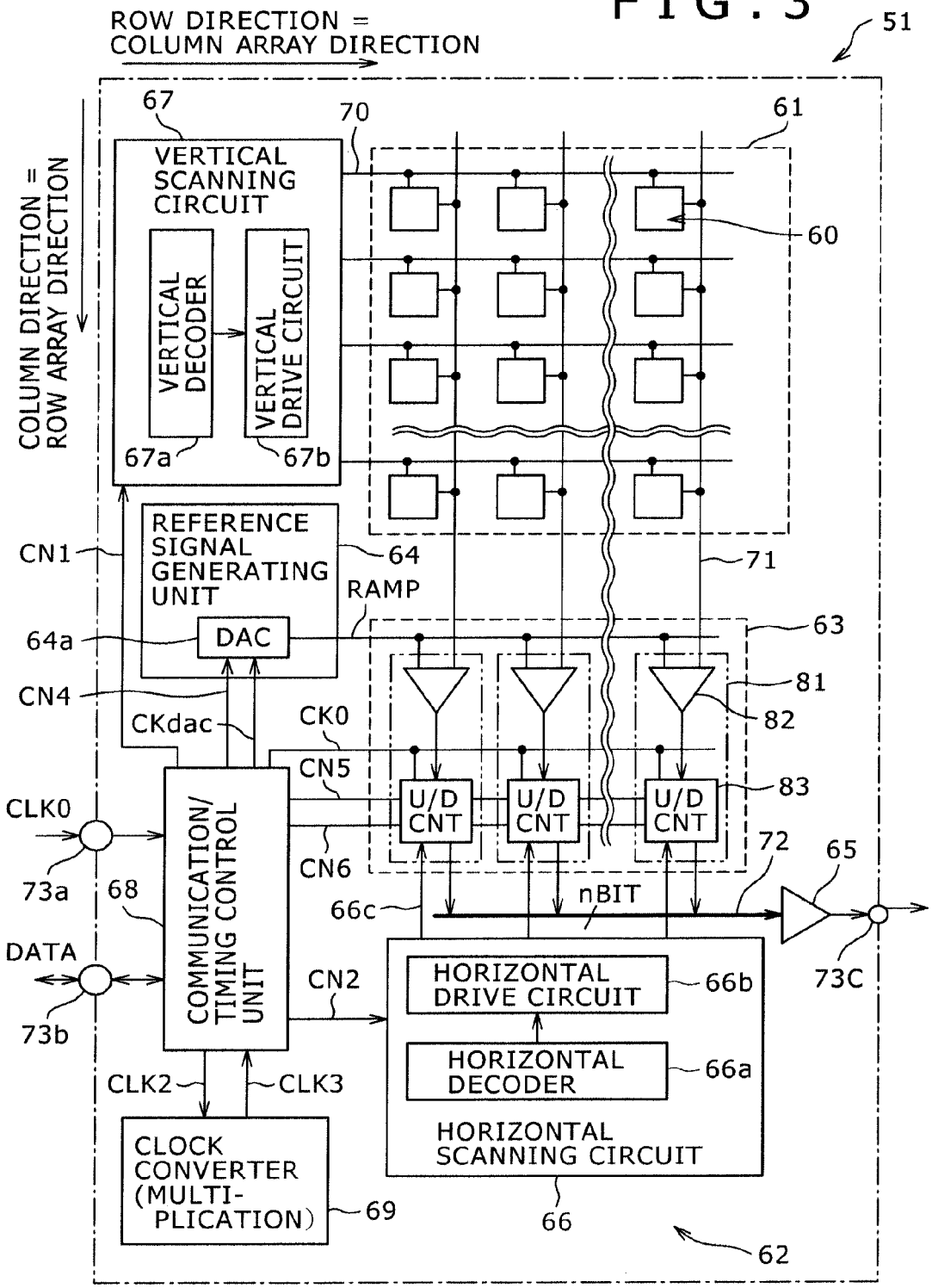
FIG. 3 is a block diagram showing a configuration example of a CMOS solid-state imaging to which an embodiment of the present invention according is applied.

FIG. 3 is a block diagram showing a configuration example according to a CMOS solid-state imaging device (CMOS image sensor) to which the present invention is applied.

The solid-state imaging device 51 includes an image capturing unit including a plurality of pixels, each including a photoelectric conversion element (charge generating portion) such as a photodiode for outputting an electrical signal corresponding to an incident light amount, disposed in rows and columns (i.e., disposed in a two-dimensional matrix shape). The solid-state imaging device 51 includes a signal processing unit provided in a column parallel manner to perform a correlated double sampling (CDS), an analog digital converter (ADC) processing, and other processing for each pixel signal (voltage signal) outputted from each pixel.

The solid-state imaging device 51 includes a pixel unit 61 as the image pickup unit including a plurality of pixels 60 each having a square shape, disposed in rows and columns (i.e., disposed in a two-dimensional matrix shape), a driving control unit 62 disposed outside the pixel unit 61, a column processing unit 63 for performing signal processing in a column parallel manner, a reference signal generating unit 64 for supplying an AD conversion reference signal to the column processing unit 63, and an output circuit 65.

The driving control unit 62 controls pixel signal sequential reading, and includes a horizontal scanning circuit 66 for controlling a column addressing and column scanning, a vertical scanning circuit 67 for controlling a row addressing and row scanning, a communication/timing control unit 68 having functions such as a function of generating an internal clock, and a clock conversion unit 69 for generating a pulse at a high speed clock frequency.

In the pixel unit 61, the pixel 60 is typically constituted of a photodiode as a photoreceptor element (charge generating unit) and an intra-pixel amplifier including an amplifier semiconductor element (e.g., a transistor).

The intra-pixel amplifier, for example, a floating diffusion amplifier configuration. For example, the charge generating unit includes a read-selection transistor as a charge read unit (transfer gate unit/read gate unit), a vertical selection transistor, and an amplifier transistor of a source-follower configuration as an a detector element for detecting a potential change at a floating diffusion. A general 4TR configuration composed of four transistors may be used as the CMOS sensor.

Alternatively, as described in Japanese Patent Publication No. 2708455, a 3TR configuration composed of three transistors may be used having an amplifier transistor connected to a drain line (DRN) and for amplifying a signal voltage corresponding signal charges generated in the charge generator element, a reset transistor for resetting the charge generator element, and a read-selection transistor (transfer gate unit) to be scanned by a vertical shift register via a transfer wiring (TRF).

The pixel 60 is connected to the vertical scanning circuit 67 via a row control line 70 for row selection and to the column processing unit 63 via a vertical signal line 71, wherein the column processing unit includes a column AD circuit 81 provided at each vertical column. The row control line 70 as used herein means interconnections from the vertical scanning circuit 67 to each pixel 60.

The horizontal scanning circuit 66 and the vertical scanning circuit 67 start reading a pixel signal of the pixel 60 to be processed, in response to a control signal CN1 or CN2 supplied from the communication/timing control unit 68. As a result, various pulse signals (e.g., a reset pulse RST, a transfer pulse TRF, a DRN control pulse DRN and the like) for driving the pixel 60 are supplied from the vertical scanning circuit 67 to each pixel 60 via the row control line 70.

The communication/timing control unit 68 is a system control unit (signal control unit) for performing driving control of the solid-state imaging device 51. The communication/timing control unit 68 has a function of a timing generator for supplying clocks and pulse signals at predetermined timings necessary for the operation of each component. The communication/timing control unit 68 has also a function of a communication interface for receiving a master clock CLK0 via a terminal 73a and data DATA for instructing an operation mode or the like via a terminal 73b, and outputting data including information on the solid-state imaging device 51.

For example, the communication/timing control unit 68 supplies a horizontal addressing signal to a horizontal decoder 66a and a vertical addressing signal to a vertical decoder 67a. In this case, since the pixels 60 are disposed in a two-dimensional matrix shape, the speed of reading out a pixel signal and pixel data is enhanced by performing vertical scan reading, i.e., accessing analog pixel signals outputted in the column direction on the row unit basis (in column parallel) via the vertical signal lines 71 and reading the analog pixel signals, and then performing horizontal scan reading, i.e., accessing pixel signals (in this example, digitalized pixel data) in the row direction which is a juxtaposed direction of the vertical columns and reading out the digitalized pixel data to the output side. The embodiment is not limited to scan reading, but random access is also possible which reads information on only a necessary pixel 60 by directly designating the address of this pixel 60.

The communication/timing control unit 68 supplies also a clock CLK1 having the same frequency as that of the master clock CLK0 inputted via the terminal 73a, a clock obtained by dividing CLK1 by 2, and a clock at a slower speed obtained by dividing CLK1 by 3 or more to each component in the device such as the horizontal scanning circuit 66, vertical scanning circuit 67 and column processing unit 63. The 2-divided clock and other clocks at frequencies lower than that of the 2-divided clock are collectively called a low speed clock CLK2.

The clock conversion unit 69 has a built-in multiplier circuit for generating a pulse having a clock frequency higher than that of the input clock. The clock conversion unit 69 receives the low speed clock CLK2 from the communication/timing control unit 68, and generates from the low speed clock CLK2 a clock having a frequency two times or higher than that of the low speed clock CLK2. As the multiplier circuit of the clock conversion circuit 69, a k1 multiplier circuit is used where k1 is a multiple number of the frequency of the low speed clock CLK2, and well-known various circuits may be used.

The vertical scanning circuit 67 selects a row of the pixel unit 61 and supplies a pulse necessary for the selected row. The vertical scanning circuit 67 includes the vertical decoder 67a for defining a readout row in the vertical direction (selecting a row of the pixel unit 61) and a vertical drive circuit 67b for supplying a pulse to the row control line 70 corresponding to the pixel 60 at the read address (in the row direction) defined by the vertical decoder 67a and driving the pixel. The vertical decoder 67a can select also a row for an electronic shutter and the like, in addition to the row for signal readout.

The horizontal scan circuit 66 sequentially selects the column AD circuits 81 of the column processing unit 63 in synchronism with the low speed clock CLK2, and outputs signals from the column AD circuits to a horizontal signal line (horizontal output line) 72. The horizontal scanning circuit 66 includes the horizontal decoder 66a for defining a readout column in the horizontal direction (selecting each column AD circuit 81 in the column processing unit 63) and a horizontal drive circuit 66b for guiding each signal of the column processing unit 63 to the horizontal signal line 72 in accordance with the readout address defined by the horizontal decoder 66a. The number of horizontal signal lines 72 is n (n is a positive integer, for example, 10) corresponding to the number n of bits processed at a time by the column AD circuit 81.

The reference signal generator unit 64 includes a digital to analog converter circuit (DAC) 64a, generates a reference signal having a ramp RAMP waveform in synchronism with a count clock CKdac from the communication/timing control unit 68 and starting from an initial value represented by control data CN4 from the communication/timing control unit 68, and supplies the reference signal to each column AD circuit 81 of the column processing unit 63.

The column AD circuit 81 converts a pixel signal supplied from each pixel 60 at each row control line 70 into n-bit pixel data. The column AD circuit 81 includes a voltage comparison unit (comparator) 82 for comparing an analog pixel signal obtained via the vertical signal line 71 from each pixel 60 at each row control line 70 with the reference signal generated by the DA converter circuit 64a of the reference signal generator unit 64, and a counter unit 83 for counting a time taken by the voltage comparison unit 82 to complete the comparison processing and holding the count result.

The communication/timing control unit 68 supplies the counter unit 83 with a mode control signal CN5 for instructing whether the counter unit 83 operates in a down-count mode or an up-count mode and a reset control signal CN6 for resetting a count held in the counter unit 83 to an initial value. A count clock CK0 is also supplied to the counter unit 83 from the communication/timing control unit 68.

By using an up/down counter (U/D CNT), the counter unit 83 performs a count processing by switching between a down-count operation and an up-count operation for pixel signals of the same processing object or pixel signals having the same physical property, in accordance with the mode control signal CN5.

The counter unit 83 is inputted with a control pulse from the horizontal scanning circuit 66 via a control line 66c. The counter unit 83 has a latch function of holding a count result, and holds a count output value until an instruction by the control pulse via the control line 66c is received.

The column AD circuit 81 performs a count operation and outputs a count result at a predetermined timing. Namely, first, the voltage comparison unit 82 compares a pixel signal input via the vertical signal line 71 with the reference signal from the reference signal generator unit 64, and when both the voltages become equal, a comparator output of the voltage comparison unit 82 is inverted (in this embodiment, transition from a high level to a low level).

The counter unit 83 starts the count operation in the down-count mode or up-count mode in synchronism with the count clock CK0. When information on inversion of the comparator output is notified to the counter unit 83, the count operation is stopped, and the count at this time is latched (held/stored) as pixel data to thereby complete AD conversion.

The counter unit 83 sequentially outputs the stored/held pixel data to the output circuit 65 in accordance with a shift operation on the basis of the horizontal select signal supplied via the control line 66c from the horizontal scan circuit 66 at a predetermined timing. The output circuit 65 buffers the input pixel data and then outputs the pixel data from an output terminal 73c.

Figure 4:
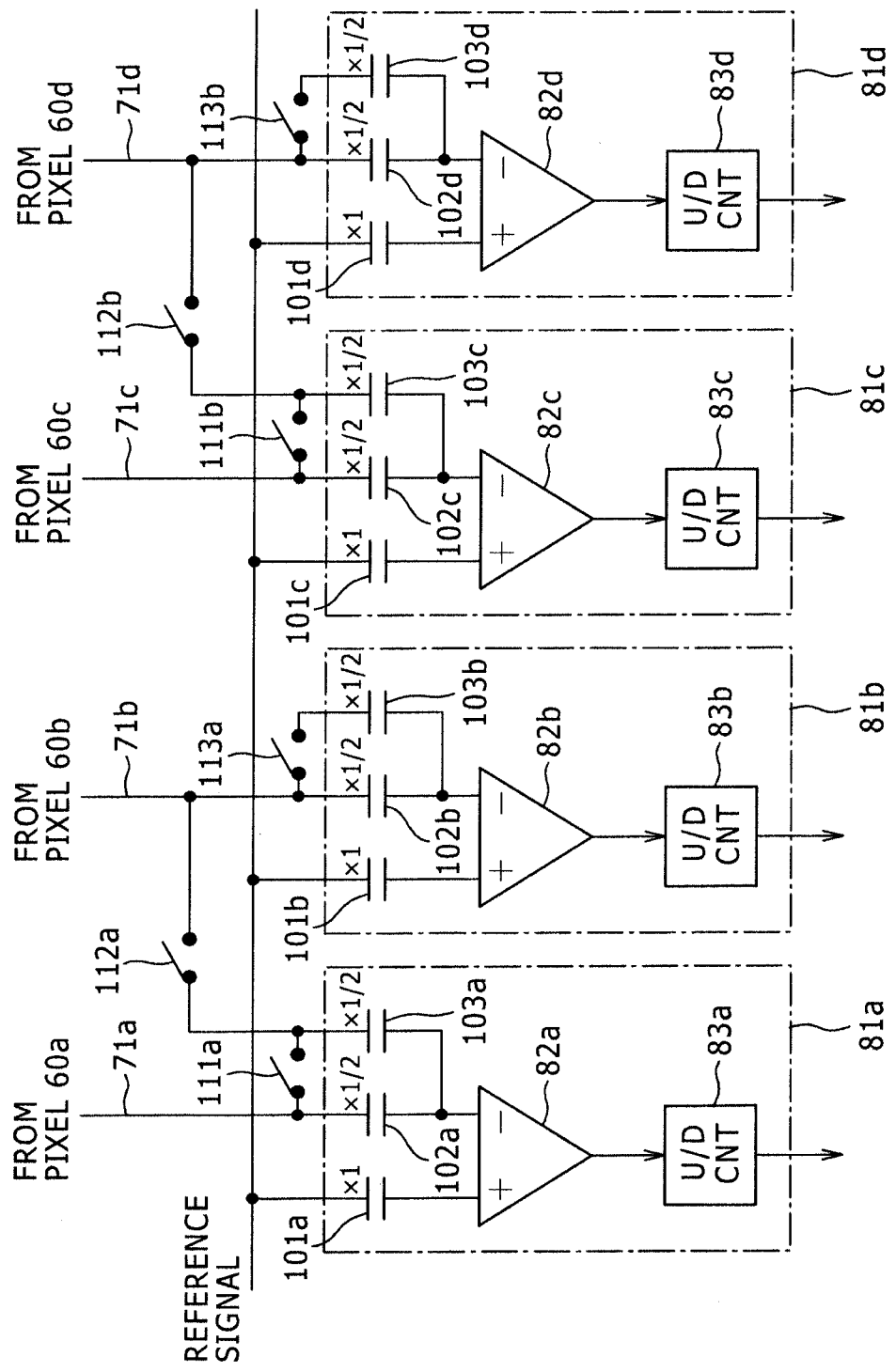
FIG. 4 is a diagram showing the detailed configuration of a circuit portion of a column processing unit.

FIG. 4 is a schematic diagram showing the detailed configurations of a circuit portion in the column processing unit 63 of the solid-state imaging device 51 shown in FIG. 3.

The column processing unit 63 includes as many column AD circuits 81 as the number of columns of the pixels 60 as apparent from reference to FIG. 3. In FIG. 4, only adjacent four column AD circuits 81 are shown. The four column AD circuits 81 are column AD circuits 81a to 81d, the reference symbols discriminating the four column AD circuits. Similarly, the vertical signal lines connected to the column AD circuits 81a to 81d are vertical signal lines 71a to 71d, respectively. The pixels 60 for outputting pixel signals via the vertical signal lines 71a to 71d are pixels 60a to 60d with the reference symbols for discrimination thereof.

In FIG. 4, the circuit portion of the column AD circuits 81c and 81d is the same as that of the column AD circuits 81a and 81b, and so description will be made only on the circuit portion of the column AD circuits 81a and 81b.

The column AD circuit 81a includes a voltage comparison unit 82a, a counter unit 83a, and capacitance elements 101a, 102a, and 103a. Similarly, the column AD circuit 81b includes a voltage comparison unit 82b, a counter unit 83b, and capacitance elements 101b, 102b, and 103b.

The capacitance element 101a of the column AD circuit 81a has one terminal point connected to the DA converter circuit 64a (FIG. 3) and the other terminal point connected to the voltage comparison unit 82a. The capacitance element 102a has one terminal point connected to the vertical signal line 71a and a switch 111a and the other terminal point connected to the voltage comparison unit 82a. The capacitance element 103a has one terminal point connected to the vertical signal line 71a via the switch 111a and connected to the vertical signal line 71b via a switch 112a and the other terminal point connected to the voltage comparison unit 82a.

The capacitance element 101b of the column AD circuit 81b has one terminal point connected to the DA converter circuit 64a (FIG. 3) and the other terminal point connected to the voltage comparison unit 82b. The capacitance element 102b has one terminal point connected to the vertical signal line 71b and a switch 113a and the other terminal point connected to the voltage comparison unit 82b. The capacitance element 103b has one terminal point connected to the vertical signal line 71b via the switch 113a and the other terminal point connected to the voltage comparison unit 82b.

Similar to the capacitance elements 12 and 13 shown in FIG. 1, the capacitance elements 101a, 102a, and 103a are used for removing DC components of the reference signal and pixel signal and accumulate a predetermined charge (reference signal or pixel signal). A capacity of charges accumulated in each of the capacitance elements 102a and 103a is a half of charges in the capacitance element 101a. In other words, a combined capacitance of the capacitance elements 102a and 103a is equal to the capacitance of the capacitance element 101a. The capacitance elements 101b, 102b, and 103b are also similar to the capacitors 101a, 102a, and 103a.

The solid-state imaging device 51 has two operation modes: a mode (hereinafter called "normal mode") of outputting a pixel signal outputted from each pixel 60 in a row direction on a pixel unit basis and a mode (hereinafter called "pixel addition mode") of outputting a pixel signal adding two adjacent pixels in the row direction. In accordance with whether the operation mode is the normal mode or pixel addition mode, the communication/timing control unit 68 controls the switches 111a to 113a and switches 111b to 113b.

Figure 5:
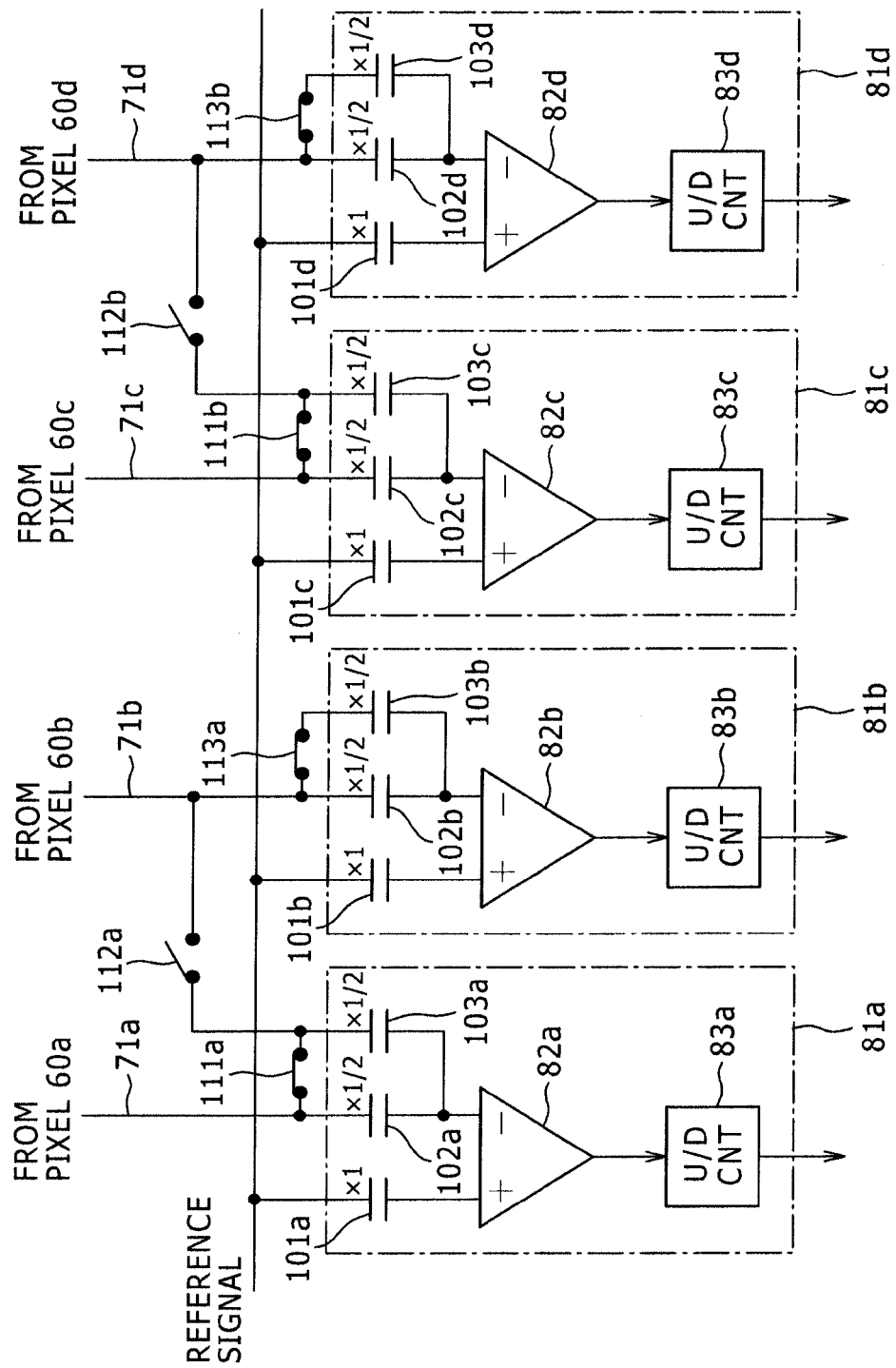
FIG. 5 is a diagram showing a normal mode state.

More specifically, when the operation mode is the normal mode, as shown in FIG. 5, the communication/timing control unit 68 turns on the switches 111a, 113a, 111b, and 113b, and turns off the switches 112a and 112b. When the operation mode is the pixel addition mode, as shown in FIG. 6, the communication/timing control unit 68 turns off the switches 111a and 111b, and turns on the switches 112a and 112b.

When the operation mode is the normal mode as shown in FIG. 5, in response to the turn-on of the switch 111a and the turn-off of the switch 112a, the capacitance elements 102a and 103a of the column AD circuit 81a are in parallel connection and a pixel signal outputted from the pixel 60a is supplied to the voltage comparison unit 82a via the capacitance elements 102a and 103a. In response to the turn-off of the switch 112a and the turn-on of the switch 113a, the capacitance elements 102b and 103b of the column AD circuit 81b are also in parallel connection and a pixel signal outputted from the pixel 60b is supplied to the voltage comparison unit 82b via the capacitance elements 102b and 103b. This also holds true for the column AD circuits 81c and 81d.

Therefore, the column AD circuits 81a to 81d have the same configuration as that of the AD conversion unit 1 described with reference to FIG. 1, so that pixel data outputted from each pixel 60 in the row direction can be outputted in units of pixels.

Figure 6:
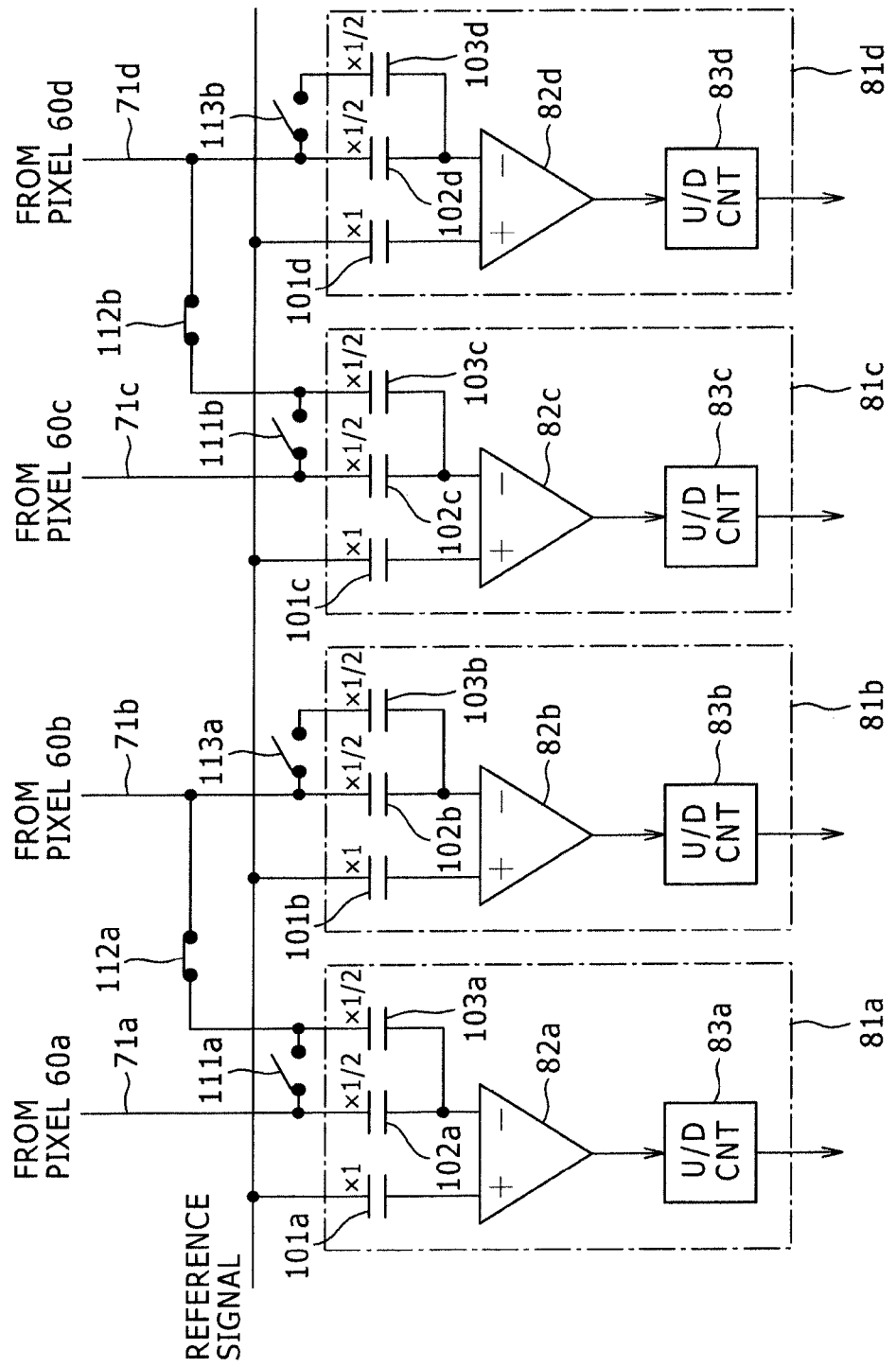
FIG. 6 is a diagram showing a pixel addition mode state.

When the operation mode is the pixel addition mode as shown in FIG. 6, in response to the turn-off of since the switch 111a and the turn-on of the switch 112a, not only the pixel signal of the pixel 60a but also the pixel signal of the pixel 60b are inputted to the voltage comparison unit 82a of the column AD circuit 81a via the capacitors 102a and 103a. As a result, the voltage comparison unit 82a compares the addition pixel signal adding both the pixel signals of the pixels 60a and 60b with the reference signal supplied via the capacitance element 101a from the DA converter circuit 64a (FIG. 3), and supplies a resultant difference signal therebetween to the counter unit 83a.

Further, in response to the turn-off of the switch 111b and the turn-on of the switch 112b, not only the pixel signal of the pixel 60c but also the pixel signal of the pixel 60d are inputted to the voltage comparison unit 82c of the column AD circuit 81c via the capacitors 102c and 103c. As a result, the voltage comparison unit 82c compares the addition pixel signal adding both the pixel signals of the pixels 60c and 60d with the reference signal supplied via the capacitance element 101c from the DA converter circuit 64a (FIG. 3), and supplies a resultant difference signal therebetween to the counter unit 83c.

Accordingly, the column AD circuits 81a and 81c can output pixel data which is addition of adjacent two pixels in the row direction.

In the pixel addition mode, the column AD circuits 81b and 81d enter a standby state in response to a standby control signal from the communication/timing control unit 68, so that the AD conversion processing (AD conversion operation) is stopped. Although the switches 113a and 113b are shown turned on in FIG. 6, the switches may either be turned on or turned off.

Figure 7:
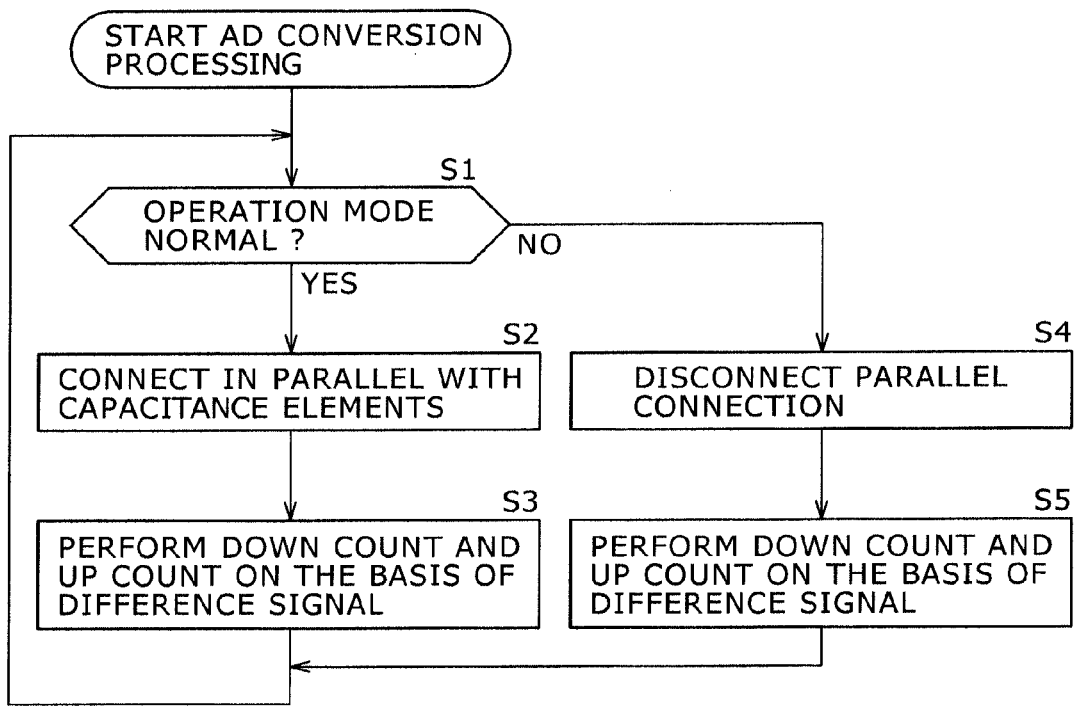
FIG. 7 is a flow chart illustrating an AD conversion process.

Next, with reference to the flow chart of FIG. 7, description will be made on the AD conversion processing to be performed by the column AD circuits 81a and 81b.

First, in step S1, the communication/timing control unit 68 determines whether the operation mode is the normal mode.

If it is determined in the step S1 that the operation mode is the normal mode, then, in step S2, the capacitance elements 102a and 103a of the column AD circuit 81a are connected in parallel and the capacitance elements 102b and 103b of the column AD circuit 81b are connected in parallel. Namely, the communication/timing control unit 68 turns on the switches 111a and 113a and turns off the switch 112a. Consequently, a pixel signal outputted from the pixel 60a is supplied to the voltage comparison unit 82a via the capacitance elements 102a and 103a, and a pixel signal outputted from the pixel 60b is supplied to the voltage comparison unit 82b via the capacitance elements 102b and 103b.

Next, in step S3, the voltage comparison unit 82a compares the pixel signal supplied from the pixel 60a via the capacitance elements 102a and 103a with the reference signal supplied from the DA converter circuit 64a via the capacitance element 101a, and supplies a resultant difference signal to the counter unit 83a. In accordance with the difference signal; the counter unit 83a down-counts or up-counts to convert the difference signal into pixel data to be outputted.

Similarly, the voltage comparison unit 82b compares the pixel signal supplied from the pixel 60b via the capacitance elements 102b and 103b with the reference signal supplied from the DA converter circuit 64a via the capacitance element 101b, and supplies a resultant difference signal to the counter unit 83b. In accordance with the difference signal, the counter unit 83b down-counts or up-counts to convert the difference signal into pixel data to be outputted.

On the other hand, if it is determined in the step S1 that the operation mode is not the normal mode, i.e., the pixel addition mode, then, in step S4, the communication/timing control unit 68 disconnects a parallel connection. Namely, the communication/timing control unit 68 turns off the switches 111a and 113a, and turns on the switch 112a. As a result, a pixel signal from the pixel 60a and a pixel signal from the pixel 60b are supplied to the voltage comparison unit 82a of the column AD circuit 81a via the capacitance elements 102a and 103a.

Then, in step S5, the voltage comparison unit 82a compares an addition pixel signal obtained by adding the pixel signals of both the pixels 60a and 60b with the reference signal supplied from the DA converter circuit 64a via the capacitance element 101a, and supplies a resultant difference signal to the counter unit 83a. In accordance with the difference signal, the counter unit 83a down-counts or up-counts to convert the difference signal into pixel data to be outputted.

The above-described processings are repetitively performed until an instruction indicating a processing completion is received. The processings in steps S2 and S4 may be omitted excepting just after a change in the operation mode.

As described above, in the solid-state imaging device 51 shown in FIG. 3, each column AD circuit 81 includes the capacitance elements 101 to 103 having a function of removing DC components, with the capacity of the two pixel signal capacitance elements 102 and 103 which is set to a half of that of the capacitance element 101. In the pixel addition mode, pixel signals of adjacent pixels are supplied to the two capacitance elements 102 and 103. It is therefore possible to output the addition pixel signal obtained by adding two adjacent pixels in the row direction.

In the pixel addition mode, since an addition processing for pixel signals is performed at the preceding stage of the voltage comparison unit 82, the operation of the column AD circuit 81 which is not inputted with the pixel signals can be stopped. Consequently, the number of column AD circuit 81 in operation can be reduced to a half of the total number of column AD circuits, and a total power consumption of the solid-state imaging device 51 can be reduced.

The addition processing of pixel signals at the preceding stage of the voltage comparison unit 82 does not require a new processing step of adding pixel data of each pixel 60, and there is an advantage that even if the pixel addition is performed, a processing time is not prolonged and is the same as that for the normal mode. In other words, the addition processing can be performed at higher speed than the case in which pixel data outputted from the output terminal is added at a later process.

Figure 2:
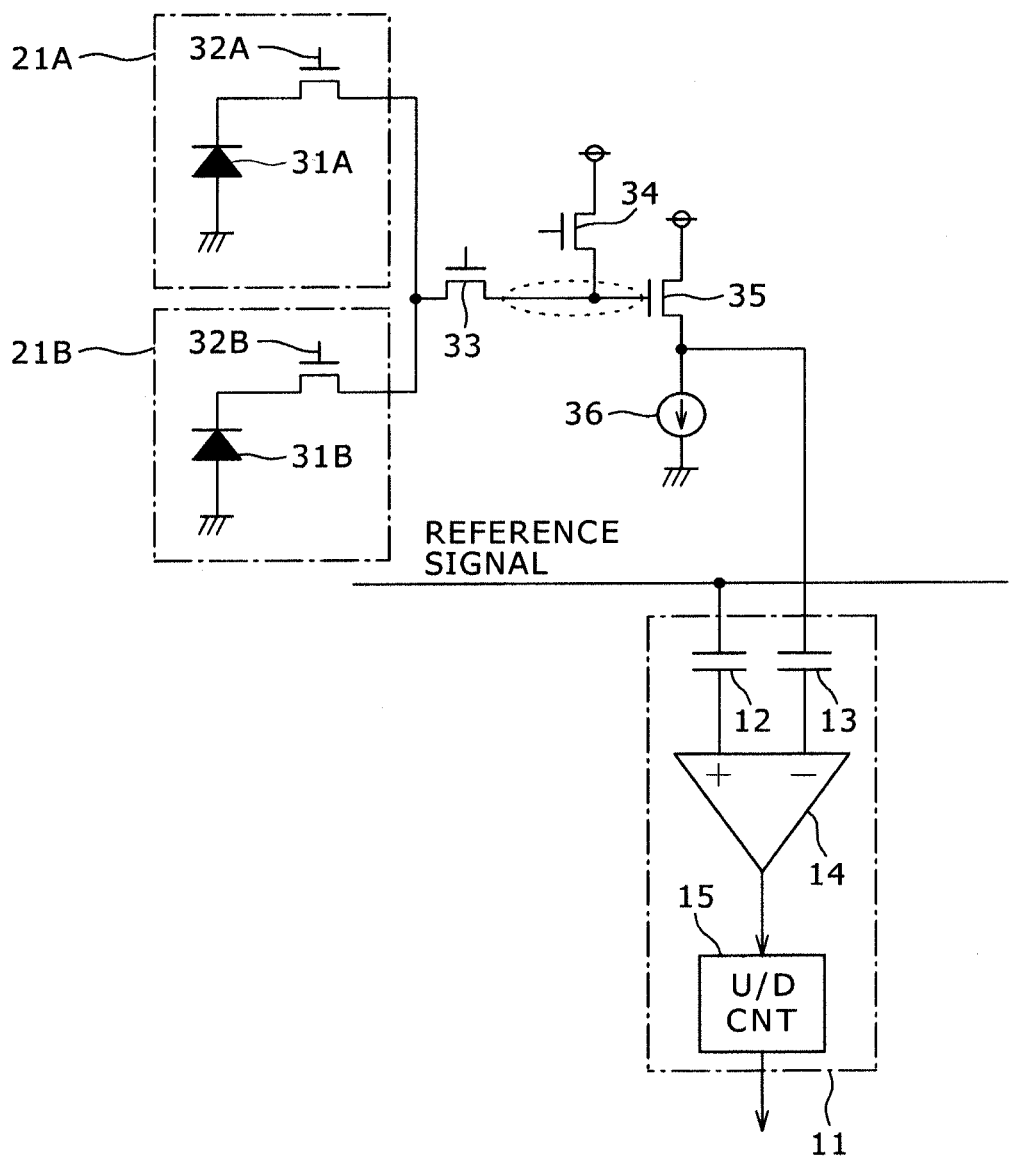
FIG. 2 is a diagram showing a configuration example of a pixel array in which adjacent pixels in the vertical direction are added.

The method of adding pixel signals by using a common FD portion described with reference to FIG. 2 is associated with a problem that addition of excess capacity of the FD portion cannot be performed. The solid-state imaging device 51 shown in FIG. 3 is not associated with this problem, so that a dynamic range of the pixel can also be expanded.

When pixel data of two pixels is to be added at the later processing, each pixel data contains noises generated in the voltage comparison unit 82, and the addition result contains noises of two columns. However, in the method described above, noises of the voltage comparison unit 82 can be suppressed to noises of one column, so that there is an advantage that noises can be reduced. The column AD conversion method has an advantage that a signal amount can be made larger than that of the column CDS method and column QV method, so that the solid-state imaging device 51 shown in FIG. 3 can enjoy also this advantage.

In FIG. 4, although the capacitance of each of the two capacitance elements 102 and 103 is set equally to a half of the capacitance of the reference signal capacitance element 101, a desired capacitance ratio may be set. For example, if a capacitance ratio between the capacitance elements 102 and 103 is set to 1:3, it is possible to obtain a pixel addition signal adding pixel signals of adjacent two pixels at a signal amount ratio of 1:3. Conversely, a capacity ratio between the capacitance elements 102 and 103 can be determined from an addition ratio of pixel signals of two pixels.

Although addition of pixel signals of two pixels has been described above by way of example, the number of pixels 60 whose pixel signals are to be added is not limited to two, but may be set to three or larger.

Figure 8:
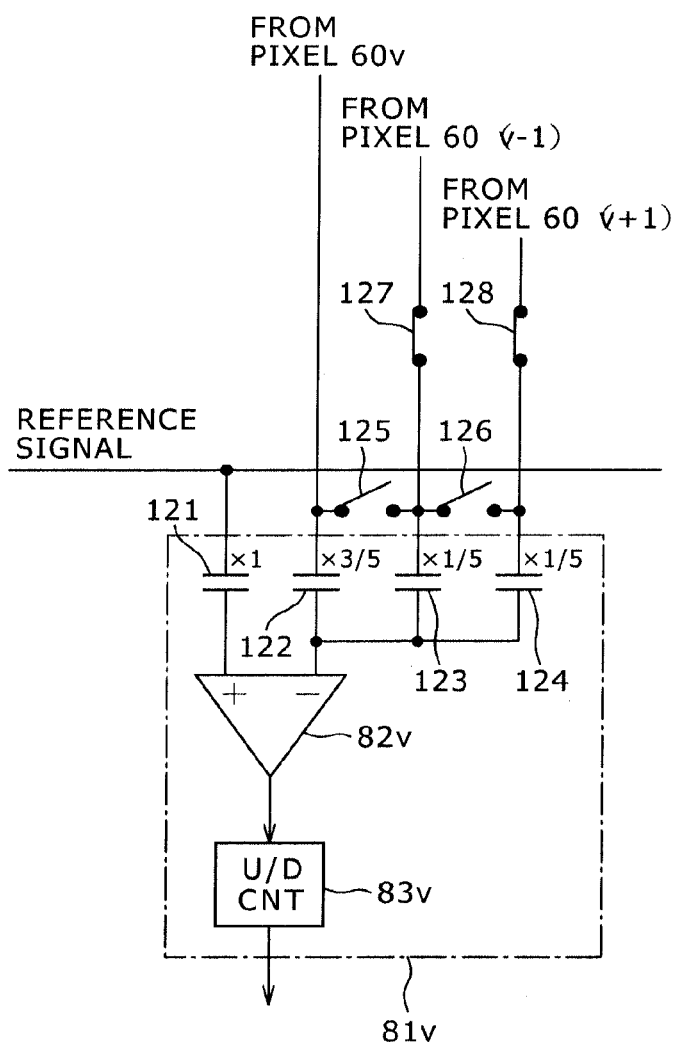
FIG. 8 is a diagram showing the detailed configuration of another circuit portion of the column processing unit.

FIG. 8 is a schematic diagram showing the detailed configuration of a circuit portion including a column AD circuit 81 according to another embodiment of the solid-state imaging device 51 shown in FIG. 3, in which pixel signals of adjacent three pixels in the row direction are added.

The column AD circuit 81 shown in FIG. 8 is a column AD circuit 81$v$ corresponding to a pixel 60$v$ at a predetermined v-th column among pixels 60 disposed in the row direction.

The column AD circuit 81$v$ shown in FIG. 8 includes a voltage comparison unit 82$v$, a counter unit 83$v$, and four capacitance elements 121 to 124. The capacitance elements 121 to 124 remove DC components of the reference signal and pixel signals similar to the capacitance elements 12 and 13 shown in FIG. 1. A capacitance of the capacitance element 122 is three-fifth capacitance of the capacitance element 121, and the capacitance of each of the capacitance elements 123 and 124 is one-fifth capacitance of the capacitance element 121. Therefore, the combined capacitance of the capacitance elements 122 to 124 is equal to that of the capacitance element 121.

The capacitance element 121 has one terminal point connected to the DA converter circuit 64$a$ (FIG. 3) and the other terminal point connected to the voltage comparison unit 82$v$. The capacitance element 122 has one terminal point connected to the voltage comparison unit 82$v$ and the other terminal point connected to the pixel 60$v$.

The capacitance element 123 has one terminal point connected to the voltage comparison unit 82$v$ and the other terminal point connected to the pixel 60($v$−1) adjacent to the pixel 60$v$ in the row direction via a switch 127. The capacitance element 124 has one terminal point connected to the voltage comparison unit 82$v$ and the other terminal point connected to the pixel ($v$+1) adjacent to the pixel 60$v$ on the side opposite to the pixel 60($v$−1) via a switch 128.

The terminal points of the capacitance elements 122 and 123 on the side opposite to the voltage comparison unit 82$v$ side are connected via a switch 125, and the terminal points of the capacitance elements 123 and 124 on the side opposite to the voltage comparison unit 82$v$ side are connected via a switch 126.

In the normal mode, the communication/timing control unit 68 turns on both the switches 125 and 126, and turns off both the switches 127 and 128. In this case, the voltage comparison unit 82$v$ compares the pixel signal of the pixel 60$v$ with the reference signal supplied from the DA converter circuit 64$a$ (FIG. 3), and outputs a resultant difference signal.

In contrast, in the pixel addition mode, the communication/timing control unit 68 turns off both the switches 125 and 126, and turns on both the switches 127 and 128. In this case, the voltage comparison unit 82$v$ compares an addition pixel signal obtained by adding three pixel signals of the pixels 60($v$−1), 60$v$, and 60($v$+1) with the reference signal supplied from the DA converter circuit 64$a$ (FIG. 3), and outputs a resultant difference signal to the counter unit 83$v$.

Since the capacitance ratio of the capacitance elements 122 to 124 is 3:1:1, the column AD circuit 81$v$ outputs pixel data obtained by adding pixel signals of three adjacent pixels 60($v$−1), 60$v$, and 60($v$+1) in the row direction at a ratio of 1:3:1.

Figure 9:
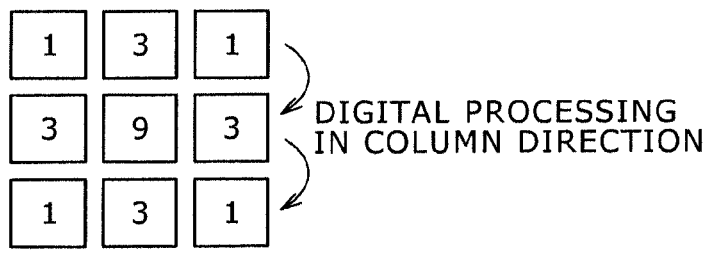
FIG. 9 is a diagram explaining a Gaussian filter.

The configuration shown in FIG. 8 can be utilized for an addition processing in the row direction, for example, when a Gaussian filter processing such as shown in FIG. 9 is performed. The Gaussian filter processing can therefore be performed at higher speed than a known processing. It is noted that, to perform the addition processing in the column direction, the processing is required to perform at a later processing after the pixel data is outputted from the output terminal 73$c$.

Since a known column CDS method and the like are difficult to obtain a desired capacitance ratio, it is difficult to set a capacitance ratio corresponding to processing of a Gaussian filter and the like. In contrast, the solid-state imaging device shown in FIG. 3 can set a desired capacitance ratio easily, as described above.

As described above, pixel addition having a simple configuration can be achieved and the power consumption can be reduced, by using a plurality of pixel signal capacitance elements which are originally provided for DC component removal, under the condition that the combined capacitance becomes equal to that of the capacitance element for DC component removal of the reference signal.

Figure 10:
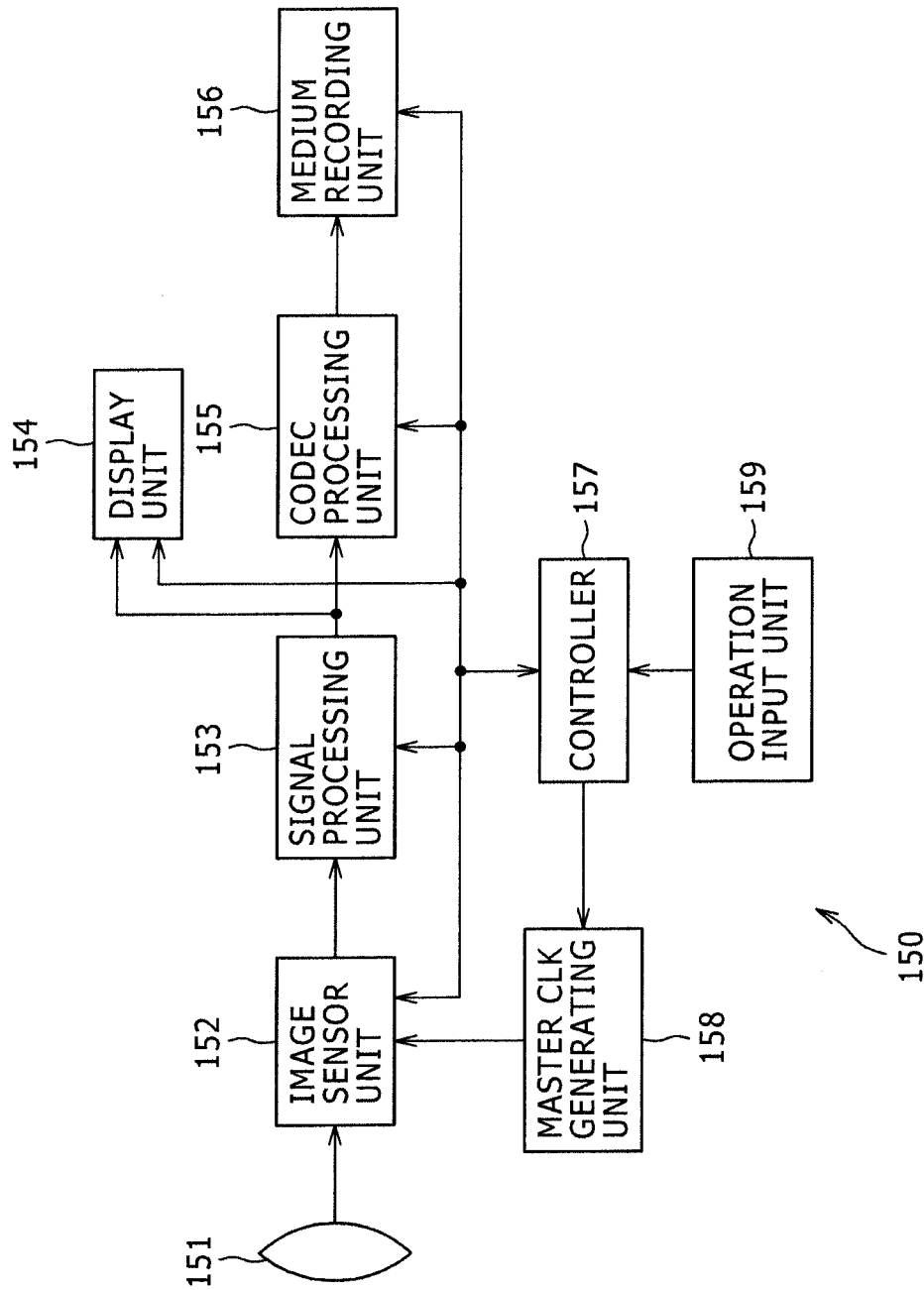
FIG. 10 is a block diagram showing a configuration example according to an imaging apparatus employing the solid-state imaging device shown in FIG. 3.

FIG. 10 is a block diagram showing a configuration example of an imaging apparatus 150 employing the solid-state imaging device 51 shown in FIG. 3. The imaging apparatus 150 may be either or both of an apparatus for image-capturing a still image, an apparatus for image-capturing a moving image.

The imaging apparatus includes: a lens 151 including a zoom optical system; an image sensor unit 152 employing the solid-state imaging device 51 shown in FIG. 3; a signal processing unit 153; a display unit 154; a codec processing unit 155; a medium recording unit 156; a controller 157; a master CLK generating unit 158; and an operation input unit 159.

The image sensor unit 152 supplies an image pickup signal (signal corresponding to pixel data of n bits) obtained through image-capturing to the signal processing unit 153, in response to a control signal from the controller 157.

The signal processing unit 153 performs predetermined signal processing such as white balance processing, gamma correction processing, and color separation processing, for the supplied image capture signal, and supplies the processed image capture signal to the display unit 154 and codec processing unit 155. The signal processing unit 153 can perform signal processing independently for each of the display unit 154 and codec processing unit 155.

The display unit 154 is composed of a liquid crystal display or the like, and displays the image capture signal from the signal processing unit 153 in the form of images. The codec processing unit 155 compresses the image capture signal from the signal processing unit 153 by a predetermined compressing method, and supplies the compressed image pickup signal to the medium recording unit 156. Under control of the controller 157, the medium recording unit 156 stores the image capture signal from the signal processing unit 153 in a recording medium such as a semiconductor memory, a magnetic disk, a magneto-optical disk and an optical disc. The recording medium may be detachably mounted on the imaging apparatus 150.

The controller 157 controls the image sensor unit 152, signal processing unit 153, display unit 154, codec processing unit 155, medium recording unit 156, and master CLK generating unit 158 in accordance with a user operation inputted from the operation input unit 159.

The master CLK generating unit 158 generates a master CLK, and supplies the master CLK to the image sensor unit 152. The operation input unit 159 includes a shutter button for instructing image-capturing, and other components such as a jog dial, a key, a lever, a button, and a touch panel, and supplies an operational signal corresponding to a user operation to the controller 157.

In the imaging apparatus 150 constructed as above, since the image sensor unit 152 has the configuration of the solid-state imaging device 51 shown in FIG. 3, pixel addition can be implemented by a simple structure and power consumption power can be reduced.

The embodiments are not limited to those described above, but various modifications are possible without departing from the gist of the present invention.

What is claimed is:

1. A solid-state imaging device which performs AD conversion for one or more analog pixel signals output from corresponding floating diffusion elements of pixels disposed in a two-dimensional matrix, the solid-state imaging device comprising:

reference signal generating means, and comparing means of a first column, at least one pixel signal accumulating means configured to provide a pixel signal supplied from a first pixel via a first column pixel signal line, the reference signal generating means being configured to generate a reference signal ramp waveform, and the comparing means of the first column being configured to output a signal when the comparing means determines that there is a predetermined relationship between the pixel signal and the reference signal;

switching means for connecting a pixel signal line of a second pixel from a second column of pixels in order to selectively provide a combined signal of the first and second pixels from corresponding first and second columns of pixels to the comparing means of the first column, and further wherein the pixel signals from the second column may also be compared via a comparing means for the second column of pixels.

2. The solid-state imaging device according to claim 1, wherein:

when connection of the second pixel signal is made to the comparing means of the first column, an operation of an AD conversion means for the second column is stopped.

3. The solid-state imaging device according to claim 1, wherein an addition ratio of pixel signals for the first and second pixels is used to determine a capacitance ratio for individual capacitors that respectively receive the first and second pixel signals and provide the pixel signals to the comparing means.

4. The solid-state imaging device according to claim 1, wherein a combined capacitance for a plurality of pixel signal accumulating means is substantially equal to a capacitance of a capacitor that receives the reference signal at the input to the comparator.

5. A method for driving a solid-state imaging device which includes, a reference signal generating means for generating a reference signal of a ramp waveform, and a comparing means of a first column of pixels for comparing at least one analog pixel signal output from a floating diffusion of a first pixel of the first column of pixels with the reference signal and outputting a signal when the comparing means determines that there is a predetermined relationship between the at least one analog pixel signal and the reference signal, thereby determining a signal level for AD conversion of the at least one analog pixel signal, the driving control method comprising:

supplying the first pixel signal from a the first pixel via the first pixel signal line;

generating the reference signal;

comparing, by the comparing means of the first column of pixels, the first pixel signal with the reference signal, and outputting a signal based on the comparison;

selectively connecting a second pixel from a second column of pixels in order to selectively provide a combined signal to the comparing means of the first column of pixels based on the accumulation of signals from floating diffusions of the first and second pixels and accumulating pixel signals from the first and second pixels; and outputting, by the comparing means of the first column of pixels, a signal based on a comparison between the accumulated pixel signals supplied from the first and second pixels and the reference signal and further wherein the pixel signals from the second column of pixels may also be compared via a comparing means for the second column of pixels.

6. An imaging apparatus including a solid-state imaging device which performs an AD conversion for analog pixel signals output from pixels disposed in a two-dimensional matrix, the solid-state imaging device comprising:

AD conversion means including, reference signal generating means, and comparing means for a first column of pixels, the comparing means for the first column of pixels being configured to receive a pixel signal supplied from a first pixel via a pixel signal line of the first column of pixels, the reference signal generating means being configured to generate a reference signal of a ramp waveform, and the comparing means of the first column of pixels being configured to output a signal based on a comparison between the pixel signal and the reference signal which identifies a predetermined relationship between the pixel signal and the reference signal;

and switching means for selectively connecting a pixel signal line of a second pixel of a second column of pixels in order to selectively provide a combined signal to the comparing means for the first column of pixels based on the accumulation of signals from the first and second pixels and further wherein the pixel signals from the second column of pixels may also be compared via a comparing means for the second column of pixels.

7. A solid-state imaging device which performs an AD conversion for analog pixel signals output from pixels disposed in a two-dimensional matrix, the solid-state imaging device comprising:

an AD conversion unit including, a reference signal generating unit, and a comparing unit for a first column of pixels, the comparing unit for the first column of pixels being configured to receive the pixel signal supplied from a first pixel via a first pixel signal line, the reference signal generating unit being configured to generate a reference signal of a ramp waveform, and the comparing unit for the first column of pixels being configured to output a signal based on a comparison between the pixel signal and the reference signal; and a switching unit for connecting a second pixel signal from a second column of pixels to the comparing unit for the first column of pixels in order to selectively provide a combined signal to the comparing unit for the first column of pixels based on the accumulation of signals from the first and second pixels and further wherein the pixel signals from the second column of pixels may also be compared via a comparing means for the second column of pixels.

* * * * *